United States Patent
Sayyah

(10) Patent No.: US 7,027,675 B2
(45) Date of Patent: Apr. 11, 2006

(54) FREQUENCY TUNING OF PHOTONIC OSCILLATOR USING AMPLIFIER BIAS VOLTAGE

(75) Inventor: Keyvan Sayyah, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 221 days.

(21) Appl. No.: 10/663,368

(22) Filed: Sep. 16, 2003

(65) Prior Publication Data

US 2005/0057791 A1     Mar. 17, 2005

(51) Int. Cl.
*G02B 6/12*     (2006.01)

(52) U.S. Cl. ............................ 385/14; 385/2; 385/15
(58) Field of Classification Search ..................... None See application file for complete search history.

(56) References Cited

U.S. PATENT DOCUMENTS

| | | | | |
|---|---|---|---|---|
| 5,777,778 | A * | 7/1998 | Yao | 359/245 |
| 6,337,660 | B1 * | 1/2002 | Esman et al. | 342/375 |
| 6,567,436 | B1 * | 5/2003 | Yao et al. | 372/32 |
| 6,580,532 | B1 * | 6/2003 | Yao et al. | 398/39 |
| 6,873,631 | B1 * | 3/2005 | Yao et al. | 372/32 |
| 6,891,149 | B1 * | 5/2005 | Lewis et al. | 250/227.14 |
| 2004/0264977 | A1 * | 12/2004 | Yap et al. | 398/161 |

OTHER PUBLICATIONS

Yao and Maleki, Optoelectronic Oscillator for Photonic Systems, IEEE Journal of Quantum Electronics, vol. 32, No. 7, pp. 1141-1149, Jul. 1996.

* cited by examiner

*Primary Examiner*—Kaveh Kianni
(74) *Attorney, Agent, or Firm*—Christopher R. Balzan

(57) ABSTRACT

In one implementation of the present invention, a method is provided for frequency tuning of a photonic oscillator. The method includes supplying an optical signal, for example laser light, which is modulated, delayed, and then converted to an electrical signal. The electrical signal is amplified, and used in modulating the optical signal. With this implementation, the frequency of the an output signal of the photonic oscillator is adjusted by adjusting a bias voltage of the amplifier. In some implementations, adjusting the frequency of the output signal further includes using a frequency lock loop circuit. In some implementations, adjusting the frequency of an output signal of the photonic oscillator further comprises adjusting at least one of an phase shifter in series with the amplifier, an optical fiber stretcher, or a bias voltage of a second amplifier. In one embodiment of the present invention, a photonic oscillator is provided including a laser and an optical modulator coupled to the laser. A lightwave delay path is coupled to the optical modulator. In some embodiments, dual lightwave delay paths are provided, such as a long loop delay path and a short loop delay path. A photodetector is coupled between the lightwave delay path and an amplifier. Typically, a bandpass filter is coupled between the amplifier and the modulating input of the optical modulator. A control circuit coupled to the amplifier is constructed so as to be capable of adjusting a bias power to the amplifier so as to shift a frequency of an output of the photonic oscillator. In some embodiments, the control circuit may include a frequency lock loop circuit.

24 Claims, 5 Drawing Sheets

FREQUENCY TUNING OF PHOTONIC OSCILLATOR USING AMPLIFIER BIAS VOLTAGE

ORIGIN OF THE INVENTION

The U.S. Government has a paid-up license in this invention and the right in limited circumstances to require the patent owner to license others on reasonable terms as provided for the terms of contract number F33615-00-C-1674 awarded by DARPA.

BACKGROUND

Photonic oscillators are capable of generating single or multi-tone RF tones. The multi-tone photonic oscillator is a very useful device for generating a set of RF tones with low phase noise and controlled tone spacing.

Typical photonic oscillators generate multi-tone oscillations from RF to millimeter waves with excellent phase noise characteristics, i.e. better than −120 dBC/Hz at 10 kHz offset frequency. There are two important characteristics of the photonic oscillator that clearly differentiates it from conventional electronic oscillators. First, unlike conventional oscillators, the phase noise of this oscillator is independent of its oscillation frequency. Second, the generated low phase noise oscillations are present both in pure electronic form as well as RF tones modulating a lightwave carrier. The latter feature enables fiber remoting of the generated multi-tones for various applications such as local oscillator signals.

The photonic oscillator can be a very compact device well suited for use in a variety of RF photonics and wireless applications requiring multiple simultaneous carrier frequencies. For example, the generation of low phase noise multi-tone RF carriers is well suited for a variety of radar and communications applications. Previous means for generating low phase noise multi-tone carriers with controllable frequency intervals often require bulky and expensive low phase noise RF synthesizers.

Frequency tuning of a photonic oscillator is important since, in most applications, it is desirable to lock its free running oscillation frequencies to a stable reference frequency using a phase locked loop or PLL method to achieve frequency stability in the oscillation tones. Alternatively, frequency tuning allows the photonic oscillator to function as a voltage-controlled-oscillator or VCO with very high spectral purities, while stabilizing its oscillation frequencies by other means such as closed loop temperature and vibration control. These oscillators are known for their low phase noise characteristics. For example, phase noise values better than −125 dBc/Hz at 10 kHz offset at 10 Ghz are routinely measured for these oscillators. Conventional electronic VCOs are not comparable, as they have phase noise performance that is far worse.

Previous methods for frequency tuning of photonic oscillators have several disadvantages. They often rely on a nonstandard component, not used in every implementation of a photonic oscillator, or they add an extra component to the oscillator solely to serve the function of frequency tuning. Furthermore, the frequency tuning range of previous photonic oscillators can be limited.

One example of frequency tuning of photonic oscillators is disclosed by S. Yao and L. Maleki in "Optoelectronic Oscillator for Photonic Systems," published in the *IEEE Journal of Quantum Electronics*, Vol. 32, No. 7, July 1996, herein incorporated by reference. In such a device, the frequency tuning of the photonic oscillator is accomplished by varying the bias voltage of a Mach-Zender electrooptic modulator in the photonic oscillator. The disclosed tuning range, however, is only about 25 kHz.

One disadvantage of the oscillator frequency tuning technique reported in the above article is that it relies on changing the bias voltage of an electrooptic modulator. The same effect, however, may not be present if another type of an optical modulator, such as for example, if an electroabsorption modulator is used in the photonic oscillator instead. In addition, it is not possible to use an external modulator such as one in which the current of the laser feeding the oscillator is directly modulated. In these photonic implementations, the frequency tuning technique described in the above article becomes completely irrelevant.

Another possible technique for frequency tuning a photonic oscillator involves changing the length of the optical fiber delay line in the feedback loop of the oscillator using piezoelectric fiber stretchers. In this technique, the frequency change $\Delta f$ is given by $\Delta f = f_0 \Delta L/L$, where $f_0$ is the oscillation frequency, L is the length of the optical fiber delay line, and $\Delta L$ is the change in the length L.

There are several drawbacks to this technique. One problem with this technique occurs in a dual fiber loop implementation of the photonic oscillator. In such an implementation, the shorter fiber loop determines the frequency spacing of the oscillation multi-tones, while the longer fiber loop improves phase noise, as determined by the above relationship. Due to the locking effect of the tones obtained by the short and long loops, however, the frequency tuning range is limited by that of the longer loop rather than the wider range obtainable if the oscillator was operating with only the short loop alone. Another disadvantage of changing the length of the fiber loop(s) for frequency tuning is the complication and cost of inserting another device in the feedback loop of the photonic oscillator.

Yet another technique to tune the oscillation frequencies of a photonic oscillator is to add an electronic phase shifter in its feedback loop. This technique can result in a large frequency tuning range. This technique, however, again adds to the complication and cost of the photonic oscillator. Furthermore, electronic phase shifters often cause significant insertion loss, and hence have to be compensated by addition gain in the photonic oscillator feedback loop. This additional gain, in turn, adds further noise to the oscillator and degrades its phase noise performance.

SUMMARY

In one implementation of the present invention, a method is provided for frequency tuning of a photonic oscillator. The method includes supplying an optical signal, for example laser light, which is modulated, delayed, and then converted to an electrical signal. The electrical signal is amplified, and used in modulating the optical signal. With this implementation, the frequency of the an output signal of the photonic oscillator is adjusted by adjusting a bias voltage of the amplifier.

In some implementations, adjusting the frequency of the output signal further includes using a frequency lock loop circuit. In some implementations, adjusting the frequency of an output signal of the photonic oscillator further comprises adjusting at least one of an electrical phase shifter in series with the amplifier, an optical fiber stretcher, or a bias voltage of a second amplifier.

In one embodiment of the present invention, a photonic oscillator is provided including a laser and an optical modulator coupled to the laser. A lightwave delay path is coupled to the optical modulator. In some embodiments, dual lightwave delay paths are provided, such as a long loop delay path and a short loop delay path. A photodetector is coupled between the lightwave delay path and an electrical amplifier. Typically, a bandpass filter is coupled between the amplifier and the modulating input of the optical modulator. A control circuit coupled to the amplifier is constructed so as to be capable of adjusting a bias power to the amplifier so as to shift a frequency of an output of the photonic oscillator. In some embodiments, the control circuit may include a frequency lock loop circuit.

DESCRIPTION

Figure 1:
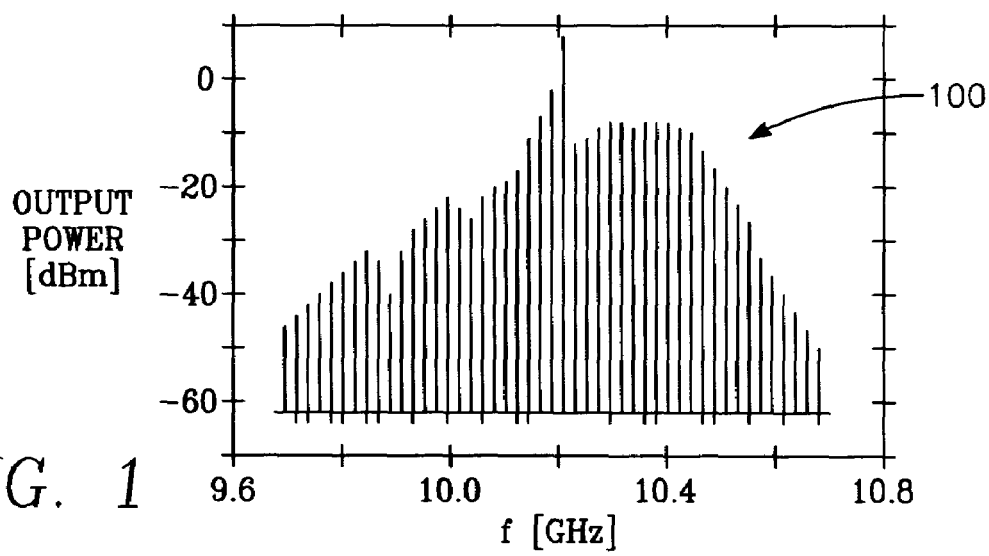
FIG. 1 illustrates an example of a multi-tone output from a photonic oscillator.

FIG. 1 illustrates an example of a multi-tone output 100 from a photonic oscillator. With reference to FIG. 1, frequency tuning involves shifting the group of tones 100 horizontally along the graph. Various embodiments and implementations of the present invention may be utilized in multi-tone as well as single tone photonic oscillators.

Figure 2:
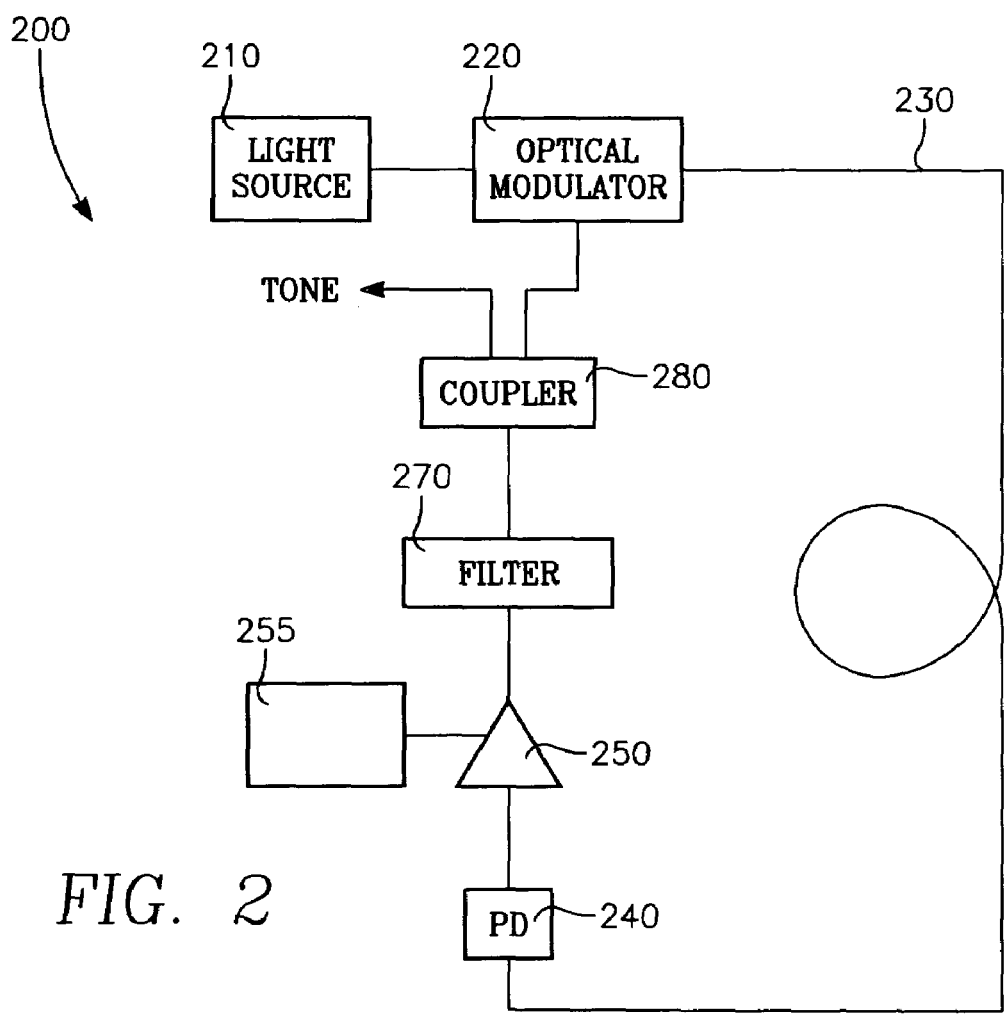
FIG. 2 shows a block diagram of a single loop photonic oscillator.

FIG. 2 shows a block diagram of a single loop photonic oscillator 200. An optical signal may be provided for the photonic oscillator 200 with for example a light source 210. The light source 210 may be a laser, such as a distributed feedback laser, or other laser. An optical modulator 220 is coupled to an output of the light source 210 for modulating the optical signal provided by the light source 210. In the embodiment of FIG. 2, the modulated optical signal is provided to an optical delay path 230, which is coupled to the optical modulator 220. In some embodiments (not shown) the modulated optical signal may also be supplied as an output signal. A photodetector 240 is coupled to the optical delay path 230 to convert the optical signal from the fiber to electrical signals, which may be provided to an electrical amplifier 250.

The electrical amplifier 250, which may be a low noise amplifier or LNA, is coupled between the photodetector 230 and the modulating input of the optical modulator 220. Multiple amplifiers (not shown) may be utilized if desired. A frequency tuning circuit 255 is connected to the amplifier 250 to adjust bias power to the amplifier 250 in response to the frequency of an output of the optical modulator 200. The frequency tuning circuit 255 may allow manual tuning, automatic tuning, or a combination of tuning means responsive to the frequency of an output of the optical modulator 200, and may be electronic, opto-electronic, electro-mechanical, or the like.

A filter 270 is coupled between the amplifier 250 and the modulating input of the optical modulator 220. A coupler 280 may be provided between the amplifier 250 and the optical modulator 220 to provide an electrical output signal. As shown in the embodiment of FIG. 2, the coupler 280 may be connected between the filter 270 and the optical modulator 220. Alternatively, it could be connected between the amplifier 250 and the filter 270.

Figure 3:
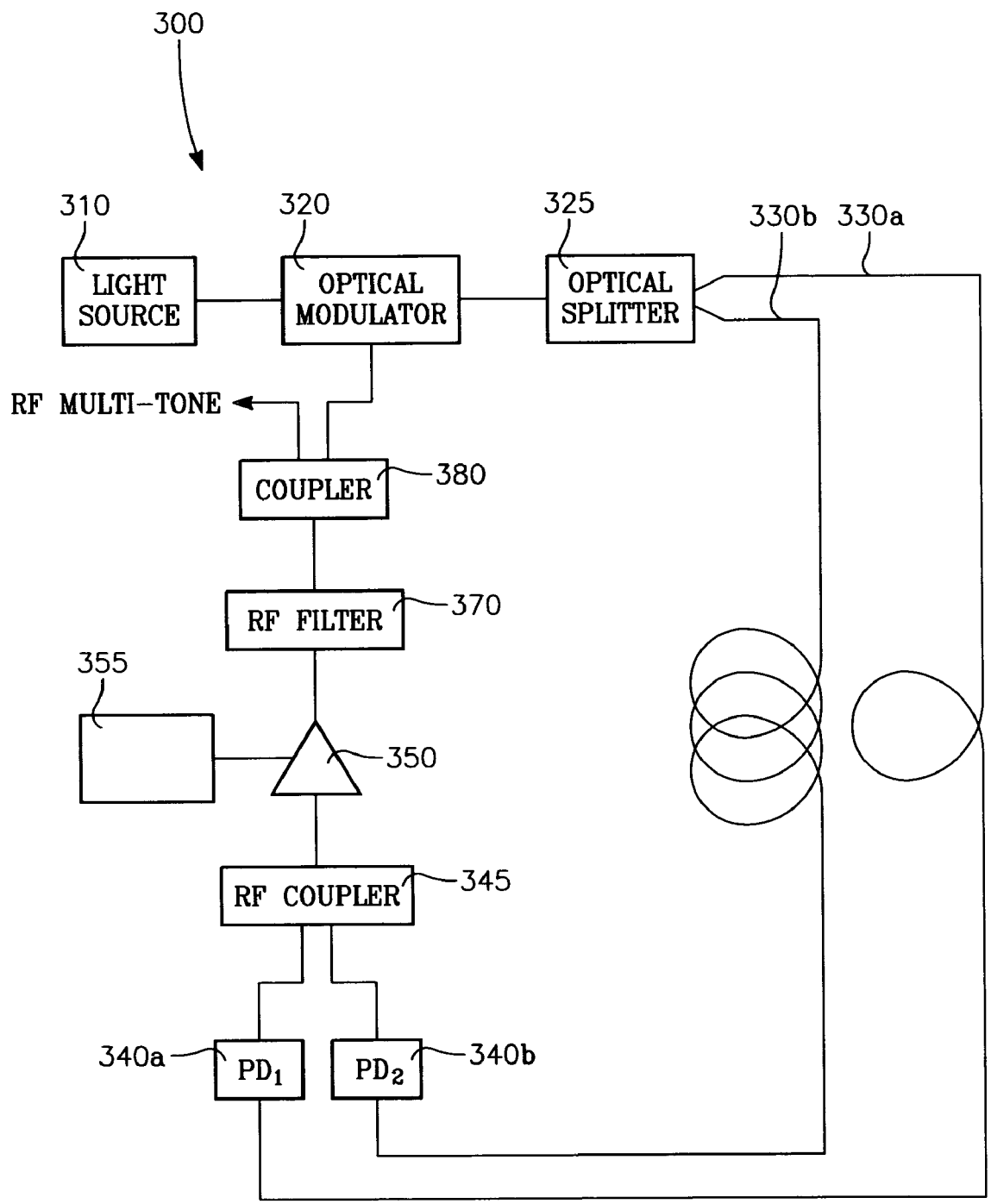
FIG. 3 shows a block diagram of a dual loop embodiment of a photonic oscillator.

The embodiment of FIG. 2 may further include an additional optical delay path as shown in FIG. 3. FIG. 3 shows a block diagram of a dual loop embodiment of a photonic oscillator 300. An optical signal is provided for the photonic oscillator 300 with a light source 310, such as a laser. An optical modulator 320 is coupled to the light source 310 for modulating the optical signal provided by the light source 310. An optical splitter 325 is coupled to the optical modulator 320 to provide signals to the short and long loop optical delay paths 330a and 330b. The short loop 330a adjusts the tone spacing, while the long loop 330b improves phase noise. The short and long loop optical delay paths 330a and 330b are coupled to photodetectors 340a and 340b, respectively. A coupler 345 couples the electrical signals from the photodetectors to an electrical amplifier 350, such as a low noise amplifier.

The electrical amplifier 350 is coupled between the photodetectors 340a and 340b and the modulating input of the optical modulator 320. A frequency tuning circuit 355 is connected to adjust bias power to the amplifier 350 in response to the frequency of an output of the optical modulator 300. The frequency tuning circuit 355 may allow manual tuning, automatic tuning, or a combination of tuning means responsive to the frequency of an output of the optical modulator 300, and may be electronic, opto-electronic, electro-mechanical, or the like.

A filter 370 is coupled between the amplifier 350 and the modulating input of the optical modulator 320. A coupler 380 may be provided between the amplifier 370 and the optical modulator 320 to provide an electrical output signal.

Although not shown in FIGS. 2 or 3, in certain embodiments, further frequency tuning may be obtained by including additional tuning apparatus. For example, in some embodiments, an electrical phase shifter may be coupled between the amplifier and the optical modulator. In some embodiments, fiber stretchers may inserted along the optical delay paths. Moreover, in some embodiments, an electrooptic modulator with bias control means may be utilized, such as a Mach-Zender electrooptical modulator. Furthermore, additional amplifiers, with or without bias power adjustment, may be included. Some, or all of the above apparatus may be present in various embodiments.

Figure 4:
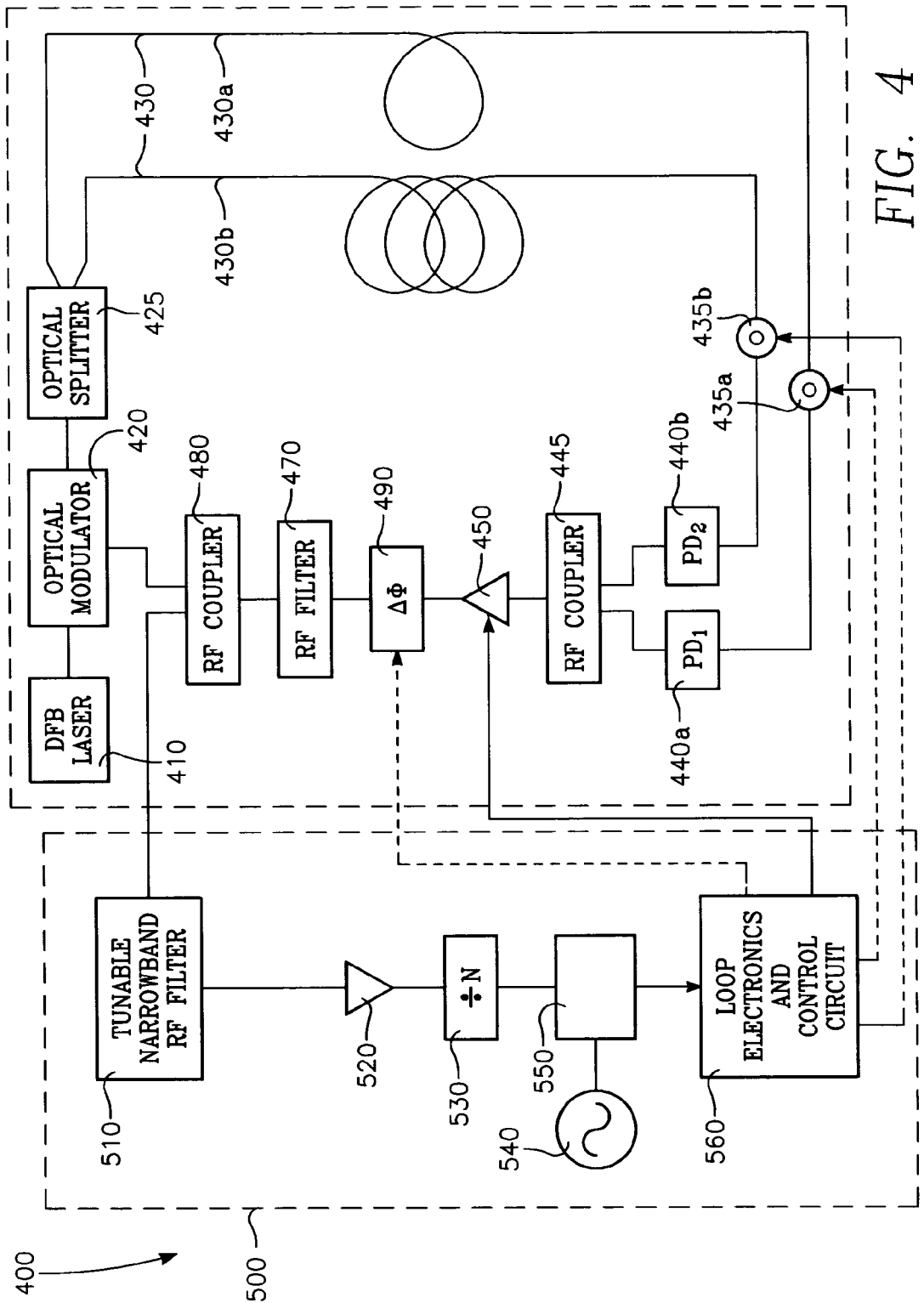
FIG. 4 shows a block diagram of one embodiment of a dual loop photonic oscillator.

FIG. 4 shows a block diagram of one embodiment of a dual loop photonic oscillator 400. In this embodiment, a distributed feedback laser 410 is coupled to an optical modulator 420. An optical splitter 425 coupled to the optical modulator 420 provides optical signals to a dual loop optical delay path 430. The dual loop optical delay path 430 includes a short loop optical delay path 430a and a long loop optical delay path 430b. The short and long loop optical delay paths 430a and 430b are coupled to photodetectors 440a and 440b, respectively. In the embodiment of FIG. 4, fiber stretchers 435a and 435b are located along the optical delay paths 430a and 430b, respectively. The fiber stretchers 435a and 435b may be utilized for further tuning of the output signal. In the embodiment of FIG. 4, an RF coupler 445 combines the electrical signals from the photodetectors and couples it to an electrical amplifier 450, such as a low noise amplifier.

The electrical amplifier 450 is coupled to a phase shifter 490, which may be utilized for further tuning. An RF coupler 480 provided between the phase shifter 490 and the optical modulator 420 provides a multi-tone electrical signal to the optical modulator 420 via a bandpass RF filter 470.

A frequency lock loop circuit 500 may be used to tune the frequency of the output signal of the photonic oscillator. In the example embodiment of FIG. 4, the frequency lock loop circuit 500 includes a narrow band filter 510 coupled to one of the outputs of the RF coupler 480. The narrow band filter 510 filters the multi-tone signal to provide a single frequency signal. An amplifier 520 coupled to the narrow band filter 510 may be provided to amplify the single frequency signal. The output of the amplifier 520 is supplied to a frequency divider 530. The frequency divider 530 along with a reference oscillator 540 is coupled to the inputs of a mixer 550. The reference oscillator 540 may be a precision low frequency oscillator. The mixer 550 output is coupled to a loop electronics and control circuit 560. The loop electronics and control circuit 560 controls the bias power of the amplifier 450 to frequency shift the multi-tone signals so as to reduce the difference between the reference signal and the divided signal.

In some embodiments, the loop and electronics circuit additionally may provide control signals to fiber stretchers 435a and 435b, a phase shifter 490, a Mach-Zender optical modulator (not shown), and/or additional amplifiers (not shown).

The frequency lock loop embodiment of FIG. 4 is provided for example purposes. Certain embodiments of the present invention can be used in other applications of voltage controlled multi-tone or single tone oscillators.

In this embodiment, the laser light, which supplies the power for the oscillator 400, is modulated by the RF signal at the electrical input of the modulator 420. The modulated lightwave is then sensed by the photodetectors 440a and 440b whose electrical output is fed back to the modulator 420 following amplification and bandpass filtering. The bandpass filter 470 sets the bandwidth of the generated RF multi-tone comb spectrum, shown in FIG. 1.

During operation, random electrical noise generated in the feedback loop modulates the laser light and is regeneratively fed back to the modulator 420 after propagating through the optical delay paths 430a and 430b and photodetection. This constitutes a positive feedback if the open loop gain of the oscillator 400 is greater than one. This amplification of the noise signals as result of positive feedback occurs at frequency intervals $\Delta f$ equal to an integer multiple of the inverse of the loop delay time $\tau$ as follows:

$$\Delta f = k/\tau$$

where
k is an integer.

This results in potential multi-tone oscillations at the above frequency intervals. The delay loop also acts as a storage medium to increase the quality factor Q of the oscillator, which is proportional to the square of the delay time of the loop as follows:

$$Q = 2\pi f \tau^2 / \delta$$

where
f is the oscillation frequency, and
$\delta$ is the input noise-to-signal ratio to the oscillator.

Thus, the oscillator phase noise S(f'), which is inversely proportional to this quality factor $$S(f') = \frac{\delta}{(2\pi)^2 (\tau f')^2}$$

where f' is the offset frequency, decreases quadratically as the optical delay in the loop is increased.

The purpose of having two optoelectronic feedback loops 430a and 430b is to be able to independently control the tone spacing of the generated multi-tones and concurrently have low phase noise oscillations. This is due to the fact that, as indicated above, both the tone spacing and the phase noise are inversely proportional to the loop delay. This implies that the generally desirable goal of generating oscillation tones with low phase noise is concurrent with multi-tones with small tone spacing. This problem can be solved by having a short and a long delay path 430a and 430b in the photonic oscillator feedback loop. The tone spacing is now determined by the inverse of the delay time in the short loop while the long delay time in the second loop determines the phase nose. FIG. 1 shows a multi-tone oscillation in a dual-loop photonic oscillator 400 with a long fiber loop of 1 km and a short fiber loop of about 8 m. This results in multi-tones with a tone spacing of about 25 MHz centered in the X band together with a phase noise of better than −125 dBc/Hz at 10 kHz offset frequency.

The multi-tone photonic oscillator described above is free-running, and hence, there is a drift in the oscillation frequencies as a result of variations in environmental parameters such as temperature and vibration. An effective method to stabilize the oscillation frequencies is to lock the photonic oscillator to a reference source with good frequency stability.

Fiber stretchers may be used to change the length of the optical fiber delay paths in the feedback loop of the photonic oscillator. In the dual loop implementation of the photonic oscillator, the fiber stretcher approach has a more limited range of frequency tuning compared to a single-loop oscillator configuration. For maximum frequency tuning, the fiber stretcher should be placed in the short fiber of the dual loop photonic oscillator since $\Delta f = f_0 \Delta L / L$. In the dual loop photonic oscillator, however, since the tones produced as a result if oscillations in the shorter loop lock to potential tones oscillating in the longer loop, the frequency shift obtained by varying the length of the short loop is less than what would have been obtained in a photonic oscillator with only the same short loop present. For example, in a photonic oscillator with a long fiber loop of 1 km and a short fiber loop of about 10 m, a frequency tuning of only 2.5 kHz was observed experimentally when either the short or the long fiber loops were stretched by about 100 μm in a PZT fiber stretcher with the other fiber loop still part of the feedback loop. With the long fiber removed from the loop, however, it was found that the frequency tuning obtained by stretching the short loop alone by the same amount (100 μm) increased to about 80 kHz. Some PZT fiber stretchers may require very high voltages in the range of 100–200 V.

Experimental Results

FIGS. 5–8

Turning to FIGS. 5–8, in one embodiment in accordance with the setup of FIG. 3, a distributed feed back laser with an output power set to about 10 mW feeds the dual-loop photonic oscillator with a long fiber loop of 1 km and a short fiber loop of 8 m. The electrical portion of the feedback loop included two low-noise amplifiers, both with gains of about 30 dB each in the X band, and a bandpass filter centered at 10 Ghz with a passband of 1 Ghz. There is also a manual electrical phase shifter in the feedback loop which allows starting of the multi-tone oscillations. The output of the electrical portion of the loop feedback into the modulation port of a Mach-Zender electrooptical modulator, thus closing the feedback loop. A multi-tone spectrum similar to the one shown in FIG. 1 was observed.

Figure 5:
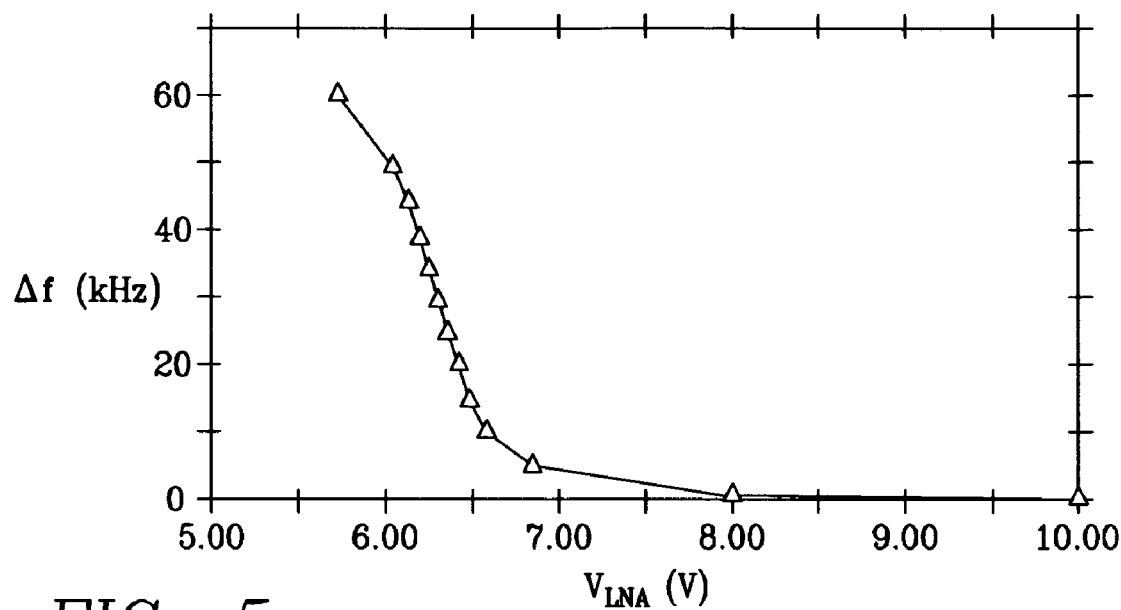
FIG. 5 illustrates an example graph of frequency tuning of a dual-loop, multi-tone photonic oscillator using an low noise amplifier bias control showing a tuning range of about 60 kHz in accordance with one implementation of the present invention.

To tune the frequency of the multi-tone photonic oscillator, the bias current of one of the electrical amplifiers in the feedback loop was varied. The result is illustrated in FIG. 5. FIG. 5 illustrates frequency tuning of a dual-loop, multi-tone photonic oscillator using an low noise amplifier bias control showing a tuning range of about 60 kHz. A frequency turning range of 60 kHz may be obtained by varying the bias voltage of the amplifier from 8V to slightly below 6V.

Figure 6:
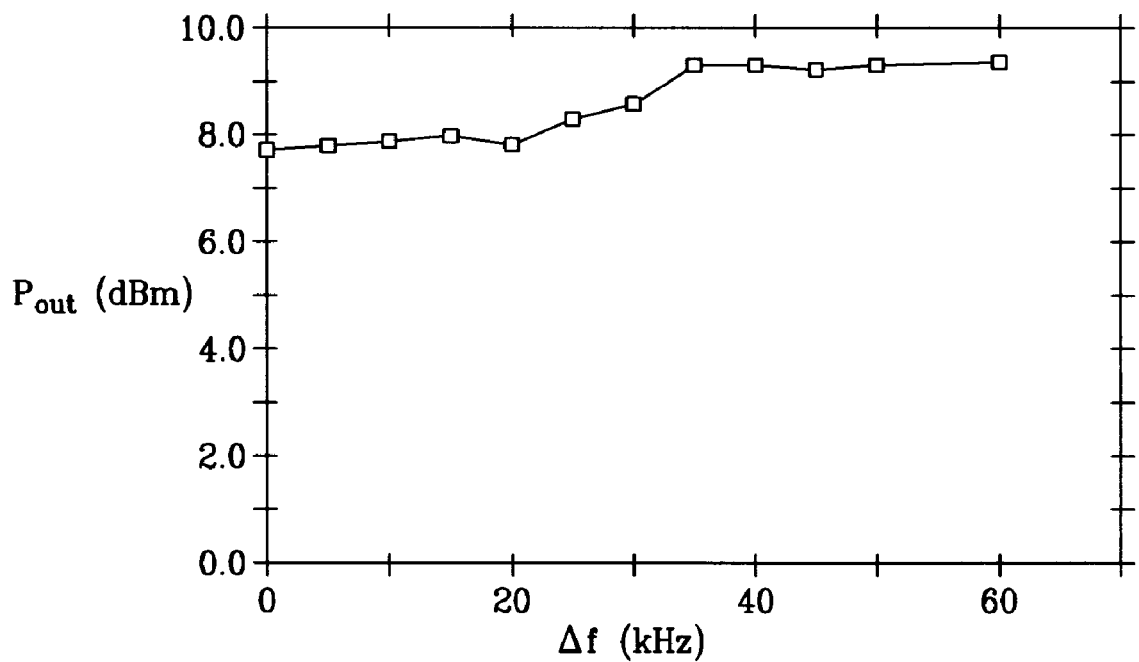
FIG. 6 illustrates an example graph output power variation of a tuned photonic oscillator verses frequency tuning for the photonic oscillator embodiment of FIG. 5.

FIG. 6 illustrates output power variation of a tuned photonic oscillator verses frequency tuning. The output power of the tuned spectral line was measured as a function of the tuning range for the embodiment discussed with reference to FIG. 5. As shown in FIG. 6, the variations in the output power $P_{out}$ were observed to be about 1.5 dB throughout the entire frequency tuning range. It should be noted that the frequency tuning range of 60 kHz was obtained with varying the bias current of only one of the amplifiers in the photonic oscillator feedback loop. By varying the bias current of the second amplifier, a range greater than 60 kHz was obtained (to about 70–80 kHz in this example embodiment). For comparison, a frequency tuning range of only 20 kHz was obtained when the bias voltage of the Mach-Zender electrooptic modulator was varied by $V_\pi/2$, the half-voltage of the modulator.

Figure 7:
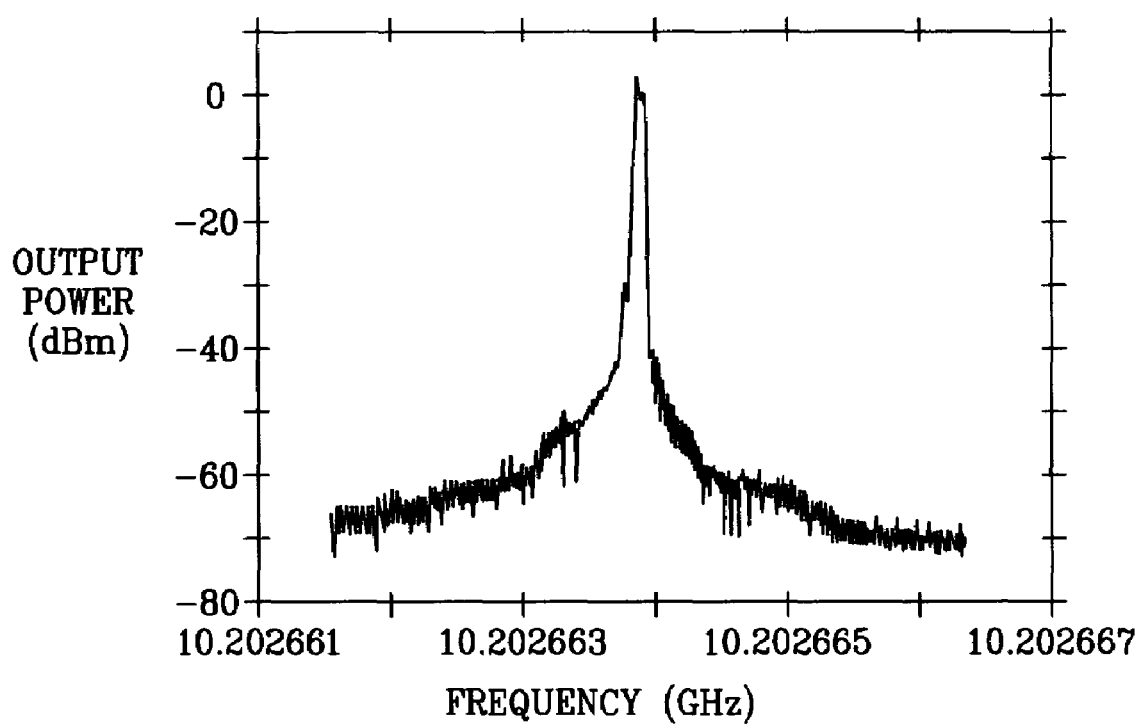
FIG. 7 illustrates an example graph of a close in, 5 kHz span, spectral purity shape of an oscillation tone in a photonic oscillator with zero frequency tuning for the photonic oscillator embodiment of FIG. 5.
Figure 8:
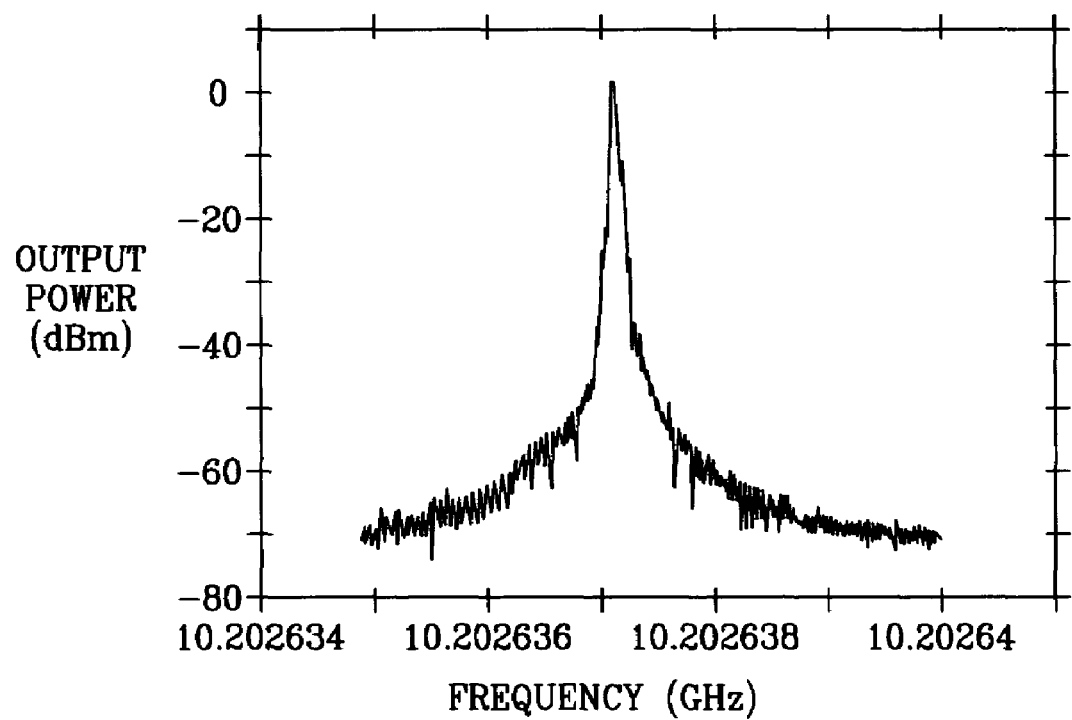
FIG. 8 illustrates an example graph of a close in, 5 kHz span spectral purity shape of an oscillation tone for the photonic oscillator embodiment of FIG. 5 with 30 kHz of frequency tuning.

Turning to FIGS. 7 and 8, the spectral purity of the oscillation tones was evaluated for the embodiment discussed with reference to FIGS. 5 and 6. FIGS. 7 and 8 show the close-in spectral purity shape of one of the oscillations tones in the multi-tone photonic oscillator at zero de-tuning in the tone frequency, and when the tone was frequency tuned by 30 kHz. FIG. 7 illustrates a close-in (5 kHz) spectral purity shape of an oscillation tone in photonic oscillator with zero frequency tuning. FIG. 8 illustrates a close-in spectral purity shape of an oscillation tone in photonic oscillator with 30 kHz frequency tuning. Thus, no change in the spectral shape was observed as a function of frequency tuning, even at a very narrow frequency span of only 5 kHz in the spectrum. This is a very good indication that the phase noise of the oscillation tone is not compromised by this frequency tuning technique.

The saturated gain of the amplifier was measured as a function of the bias voltage for the above embodiment. A reduction of the amplifier gain by about 3 dB was observed for the range of the bias voltage that resulted in a frequency tuning of about 60 kHz. In contrast, a more significant change in the magnitude of the open loop gain is obtained when the bias voltage of the Mach-Zender electrooptic modulator is changed by $V_\pi/2$, the half-voltage of the modulator, yields only a 20 kHz frequency tuning range. Therefore, the frequency tuning of the photonic oscillator is not primarily due to the decrease in the magnitude of the open loop gain as the amplifier voltage is reduced. It is further contemplated that the electric phase change in the amplifier as its bias voltage is reduced may have contributed to the observed tuning range of the frequency. Nevertheless, the amplifier voltage-induced frequency tuning allows for a significantly larger tuning range, which may be accomplished without compromising the spectral purity of the oscillation tones.

Having described this invention in connection with a number of embodiments, modification will now certainly suggest itself to those skilled in the art. As such, the invention is not to be limited to the disclosed embodiments except as required by the appended claims.

What is claimed is:

1. A photonic oscillator comprising:
   a) a light source;
   b) an optical modulator coupled to the light source;
   c) at least one lightwave delay path coupled to the optical modulator;
   d) at least one photodetector coupled to the at least one lightwave delay path;
   e) a first amplifier coupled between the photodetector and the optical modulator;
   f) a bandpass filter coupled between the first amplifier and the optical modulator; and
   g) a control circuit coupled to the first amplifier constructed so as to be capable of adjusting a bias power to the first amplifier to shift a frequency of an output of the photonic oscillator.

2. The photonic oscillator of claim 1 wherein the at least one lightwave delay path comprises:
   a) a short loop lightwave delay path; and
   b) a long loop lightwave delay path coupled in parallel with the short loop lightwave delay path.

3. The photonic oscillator of claim 2 comprising:
   a) an optical splitter coupling the long and short loop lightwave delay paths to the optical modulator;
   b) a photodetector coupled to each of the long and short loop lightwave delay paths; and
   c) a coupler coupling the photodetectors of the long and short loop lightwave delay paths to the first amplifier.

4. The photonic oscillator of claim 2 further comprising a fiber stretcher located along at least one of: (a) the short loop lightwave delay path, or (b) the long loop lightwave delay path.

5. The photonic oscillator of claim 4 comprising a fiber stretcher in each of the short loop lightwave delay path and the long loop lightwave delay path.

6. The photonic oscillator of claim 5 further comprising a phase shifter coupled between the first amplifier and the bandpass filter.

7. The photonic oscillator of claim 2 wherein the control circuit comprises a frequency lock loop circuit.

8. The photonic oscillator of claim 7 wherein the frequency lock loop circuit comprises:

a) a narrowband filter coupled to the photonic oscillator so as to be capable of filtering a multi-tone electrical signal to provide a single tone electrical signal;

b) a frequency divider coupled to the narrowband filter;

c) a precision low frequency oscillator; and d) a mixer coupled to receive signals from the frequency divider and the precision oscillator so as to provide a mixed output signal capable of use in adjusting the bias power to the first amplifier.

9. The photonic oscillator of claim 7 further comprising a coupler located between the first amplifier and the optical modulator, and wherein the frequency lock loop comprises:

a) a narrowband filter coupled to the coupler;

b) a frequency lock loop amplifier coupled to the narrow band filter;

c) a frequency divider coupled to the frequency lock loop amplifier;

d) a mixer coupled to receive signals from the frequency divider and a low frequency precision oscillator, the mixer being coupled to the control circuit so as to provide a mixed output signal to the control circuit; and e) the control circuit being responsive to the mixed output signal to control the bias voltage of the first amplifier.

10. The photonic oscillator of claim 9 further comprising a phase shifter coupled between the first amplifier and the bandpass filter, and wherein the control circuit is constructed to control the phase shifter in response to the mixed output signal.

11. The photonic oscillator of claim 9 further comprising a fiber stretcher located along at least one of: (a) the short loop lightwave delay path, or (b) the long loop lightwave delay path, and wherein the control circuit is constructed to control the fiber stretcher in response to the mixed output signal.

12. The photonic oscillator of claim 11 comprising a fiber stretcher in each of the short loop lightwave delay path and the long loop lightwave delay path, and wherein the control circuit is constructed to control each fiber stretcher in response to the mixed output signal.

13. The photonic oscillator of claim 1 wherein the control circuit comprises a phase lock loop circuit.

14. The photonic oscillator of claim 1 further comprising a second amplifier coupled between the photodetector and the optical modulator.

15. The photonic oscillator of claim 1 further comprising a phase shifter coupled between the first amplifier and the bandpass filter.

16. A photonic oscillator comprising:

a) a laser;

b) an optical modulator coupled to the laser;

c) a lightwave delay path coupled to the optical modulator comprising:

(i) a short loop lightwave delay path; and (ii) a long loop lightwave delay path coupled in parallel with the short loop lightwave delay path;

d) a first amplifier coupled between the photodetector and the optical modulator;

e) a bandpass filter coupled between the first amplifier and the optical modulator;

f) a bandpass filter coupled between the first amplifier and the optical modulator; and g) a means for shifting a frequency of an output of the photonic oscillator comprising a bias power adjusting means allowing adjustment of the bias power to the first amplifier.

17. The photonic oscillator of claim 16 wherein the means for shifting the frequency of the output of the photonic oscillator comprises a frequency lock loop circuit.

18. The photonic oscillator of claim 17 further comprising a fiber stretcher located in each of the short loop lightwave delay path and the long loop lightwave delay path, the fiber stretcher of each of the short loop delay path and the long loop delay path being capable of shifting the frequency of the output of the photonic oscillator in response to the frequency lock loop circuit.

19. The photonic oscillator of claim 17 further comprising a phase shifter coupled between the first amplifier and the bandpass filter, the phase shifter being responsive to the frequency lock loop circuit.

20. The photonic oscillator of claim 17 further comprising:

a) an optical splitter coupling the long and short loop lightwave delay paths to the optical modulator;

b) a photodetector coupled to each of the long and short loop lightwave delay paths; and c) a coupler coupling the photodetectors of the long and short loop lightwave delay paths to the first amplifier.

21. The photonic oscillator of claim 17 wherein the frequency lock loop circuit comprises:

a) a narrowband filter coupled to the photonic oscillator so as to be capable of filtering a multi-tone electrical signal to provide a single tone electrical signal;

b) a frequency divider coupled to the narrowband filter;

c) a precision low frequency oscillator; and d) a mixer coupled to receive signals from the frequency divider and the precision oscillator so as to provide a mixed output signal capable of use in adjusting the bias power to the first amplifier.

22. A photonic oscillator comprising:

a) a laser;

b) an optical modulator coupled to the laser;

c) a lightwave delay path coupled to the optical modulator comprising:

(i) a short loop lightwave delay path;

(ii) a long loop lightwave delay path coupled in parallel with the short loop lightwave delay path;

(iii) an optical splitter coupling the long and short loop lightwave delay paths to the optical modulator;

(iv) a photodetector coupled to each of the long and short loop lightwave delay paths;

(v) a coupler coupling the photodetectors of the long and short loop lightwave delay paths to the first amplifier; and (vi) a fiber stretcher in each of the short loop lightwave delay path and the long loop lightwave delay path;

d) a first amplifier coupled between the photodetector and the optical modulator;

e) a phase shifter coupled between the first amplifier and the bandpass filter;

f) a bandpass filter coupled between the first amplifier and the optical modulator; and g) a control circuit capable of adjusting a bias power to the first amplifier so as to shift a frequency of an output of the photonic oscillator, the control circuit being responsive to a frequency lock loop circuit.

23. The photonic oscillator of claim 22 wherein the frequency lock loop circuit comprises:

a) a narrowband filter coupled to the photonic oscillator so as to be capable of filtering a multi-tone electrical signal to provide a single tone electrical signal;

b) a frequency divider coupled to the narrowband filter;

c) a precision low frequency oscillator; and d) a mixer coupled to receive signals from the frequency divider and the precision oscillator so as to provide a mixed output signal capable of use in adjusting the bias power to the first amplifier.

24. The photonic oscillator of claim 23 wherein the control circuit is constructed to control the phase shifter in response to the mixed output signal, and wherein the control circuit is constructed to control the phase shifter in response to the mixed output signal.

* * * * *